United States Patent [19]
Grunbok et al.

[11] Patent Number: 5,278,800
[45] Date of Patent: Jan. 11, 1994

[54] MEMORY SYSTEM AND UNIQUE MEMORY CHIP ALLOWING ISLAND INTERLACE

[75] Inventors: Warren W. Grunbok, Poughkeepsie; Billy J. Knowles, Kingston; William R. Milani, Woodstock, all of N.Y.; Douglas R. Moran, Austin, Tex.; Dale E. Pontius, Colchester, Vt.; Donald W. Price, Lake Katrine, N.Y.; Robert Tamlyn, Jericho, Vt.; Yee-Ming Ting, Cornwall; De Tran, Woodstock, both of N.Y.; Henry Yeh, Acton, Mass.

[73] Assignee: International Business Machines Corporation, Armonk, N.Y.

[21] Appl. No.: 786,139

[22] Filed: Oct. 31, 1991

[51] Int. Cl.$^5$ ............................................. G11C 7/00
[52] U.S. Cl. ........................ 365/230.01; 365/230.03; 365/189.03; 395/400
[58] Field of Search ............... 365/189.01, 230.01, 365/1189.03, 230.03; 395/400

[56] References Cited

U.S. PATENT DOCUMENTS

| | | | |
|---|---|---|---|
| 3,449,723 | 6/1969 | Anderson et al. | 340/172 |
| 3,863,232 | 1/1975 | Johnson et al. | 340/173 |
| 4,117,546 | 9/1978 | Anatha et al. | 365/233 |
| 4,558,436 | 12/1985 | Wagensonner et al. | 365/230 |
| 4,816,916 | 3/1989 | Akiyama | 358/213 |
| 4,924,375 | 5/1990 | Fung et al. | 364/200 |
| 4,954,987 | 9/1990 | Auvinen et al. | 365/189 |
| 5,150,328 | 9/1992 | Aichelmann, Jr. | 365/189.03 |

Primary Examiner—Eugene R. LaRoche
Assistant Examiner—Viet Q. Nguyen
Attorney, Agent, or Firm—Floyd A. Gonzalez; Robert L. Troike

[57] ABSTRACT

A memory system and a unique memory chip is disclosed wherein multiple islands on a chip can be separately accessed by separate island controllers whereby concurrent use of the several islands or arrays on a chip can be achieved.

5 Claims, 12 Drawing Sheets

MEMORY SYSTEM AND UNIQUE MEMORY CHIP ALLOWING ISLAND INTERLACE

This invention relates to a memory system and more particularly to a memory system with interlaced chip groups and interlaced islands on the same chip.

BACKGROUND OF THE INVENTION

Memory systems comprising pluralities of memory elements or Basic Storage Modules (BSMs) as illustrated in FIG. 1 are well known in the State of the Art. Further, it is known that these memory elements may include a plurality of rows of memory chips such as, for example, 8 rows. Each chip may include a plurality of 8 or 9 bit wide arrays or islands. Each island comprises 32K bit arrays. In the prior art when one accesses a given chip group in a row doing either a fetch or a store command the entire BSM or memory element is held busy for whatever number of cycles until the fetch and the store is complete. U.S. Pat. No. 4,924,375 describes page interleaved memory access. This is a technique for accessing pages by having banks of memory elements activated separately. U.S. Pat. No. 4,954,987 discloses an interleaved sensing system for FIFO and burst mode memories. U.S. Pat. Nos. 3,863,232 and 3,449,723 show interleaving memory systems and U.S. Pat. Nos. 4,117,546, 4,558,436 and 4,816,916 show interlacing of chips. U.S. Pat. No. 4,816,916 discloses a CCD area image sensor operable in both line sequential and interlace scannings and a method for operating the same. The prior art requires a multitude of machine cycles to store or retrieve data from a given memory element.

An object of the present invention is to provide a high data rate to and from memory systems and the servicing of a high number of requests simultaneously.

SUMMARY OF THE INVENTION

In accordance with one embodiment of the present invention and improved memory system comprises a plurality of memory elements where each element is separately addressable and each element includes memory chip groups with each group including a plurality of memory chips. The memory elements are capable of being either read from or written into simultaneously on every computer cycle. Each memory chip group is interlaced and started at an offset time and each chip group within each chip comprises islands with addressing to each island. The element includes logic means within each element to steer the address to the correct island on the memory chip.

DESCRIPTION OF DRAWINGS

FIG. 3 illustrates the format of a BSM request.

FIG. 3A illustrates the format of an input request to the input request register of a BSM.

DESCRIPTION OF THE PREFERRED EMBODIMENT

Figure 1:
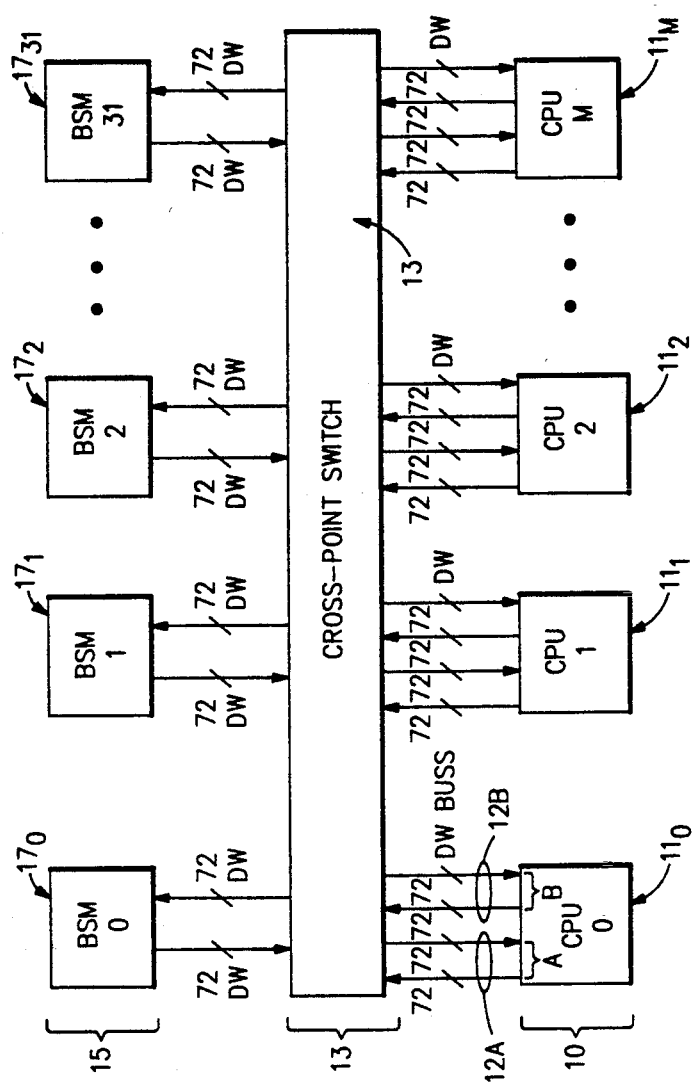
FIG. 1 is a block diagram of a computer system according to the present invention.

Referring to FIG. 1 there is illustrated a block diagram of a computer system 10 including the memory design according to the present invention. The system comprises a plurality of processor CPUs $11_0$ to $11_M$ coupled to a cross-point switch 13 via pairs of uni-directional double word buses 12A and 12B. Each processor $11_0$ to $11_M$ includes, for example, a scalar unit and vector unit. A single quadword bus may be used in place of two double word buses 12A and 12B. A quadword is 128 data bits plus 16 parity bits for a total of 144 bits. The double word bus handles 64 bits plus 8 parity bits. A memory system 15 is coupled to the cross point switch via pairs of undirectional double word buses 18A and 18B.

The memory system 15 comprises, for example, 32 memory elements or 32 BSMs (Basic Storage Modules) 17 as represented by BSMs $17_0$ to $17_{31}$. Coupled to each of the BSMs $17_0$ to $17_{31}$ are two uni-directional buses 18A and 18B.

Figure 2:
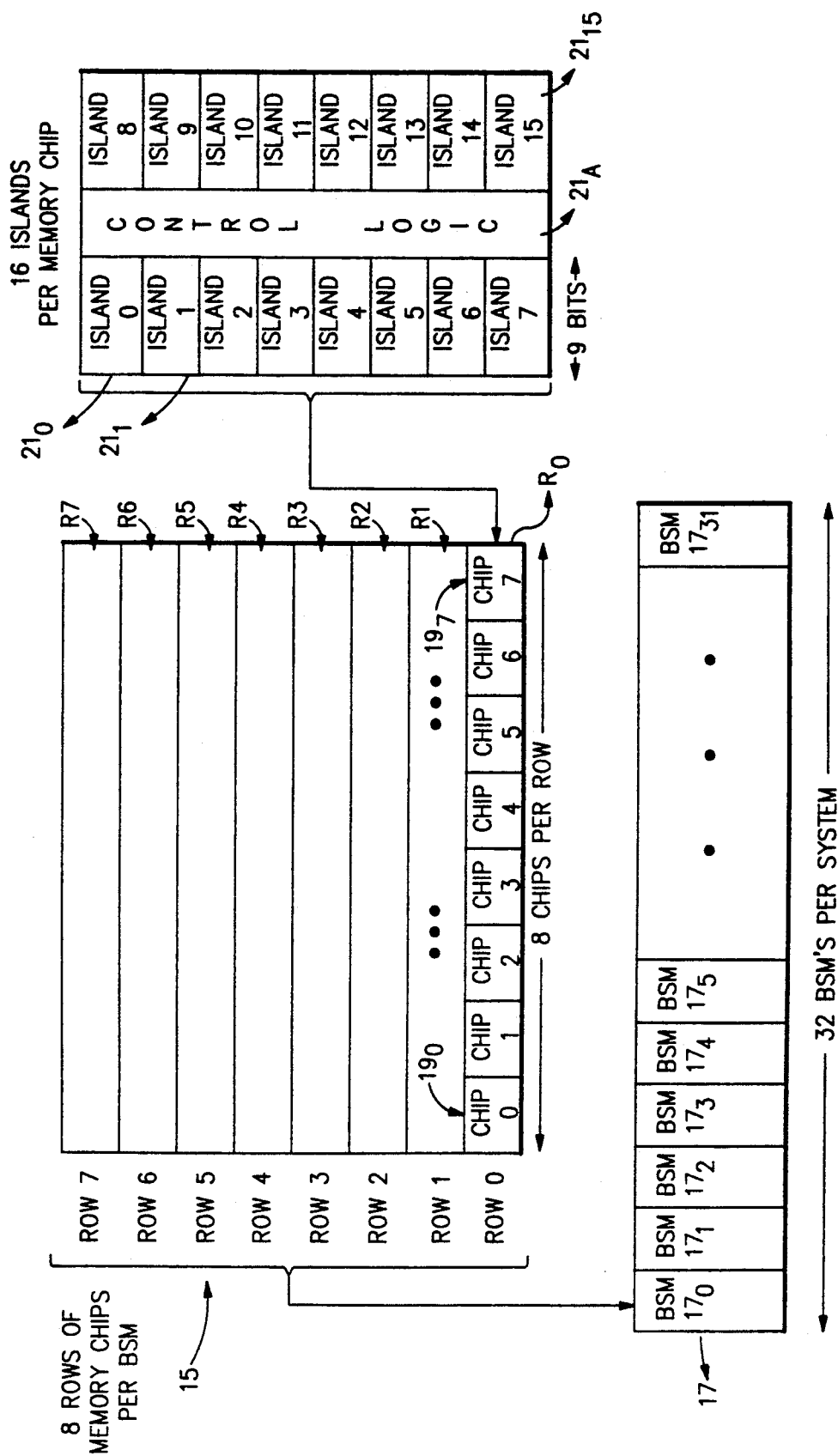
FIG. 2 illustrates the memory system according to the present invention

Referring to FIG. 2 there is illustrated the memory system structure 15 of the present invention. Each of the BSMs $17_0$ through $17_{31}$ comprises 8 rows or groups of chips as represented by rows $R_0$ through $R_7$. There are, for example, 8 chips $19_0$ through $19_7$ per row as illustrated. Each chip 19 comprises 16 memory islands $21_0$ through $21_{15}$ and a control logic section 21A. Each island or array comprises 32K (K=1024) addressable locations. Each location contains 9 bits. An address from a processor 11 (as shown in FIG. 3) includes a BSM number or address (addressing one of BSMs $17_0$ through $17_{31}$ followed by a row or double word address number (rows $R_0$ through $R_7$) followed by an array or island identification number (addressing one of memory islands $21_0$ through $21_{15}$), the island word address (one of 32K) and control bits for read and write. The crosspoint switch 13 selects the BSM from the address and passes the remainder to the selected BSM as shown in the format of FIG. 3A.

Figure 4:
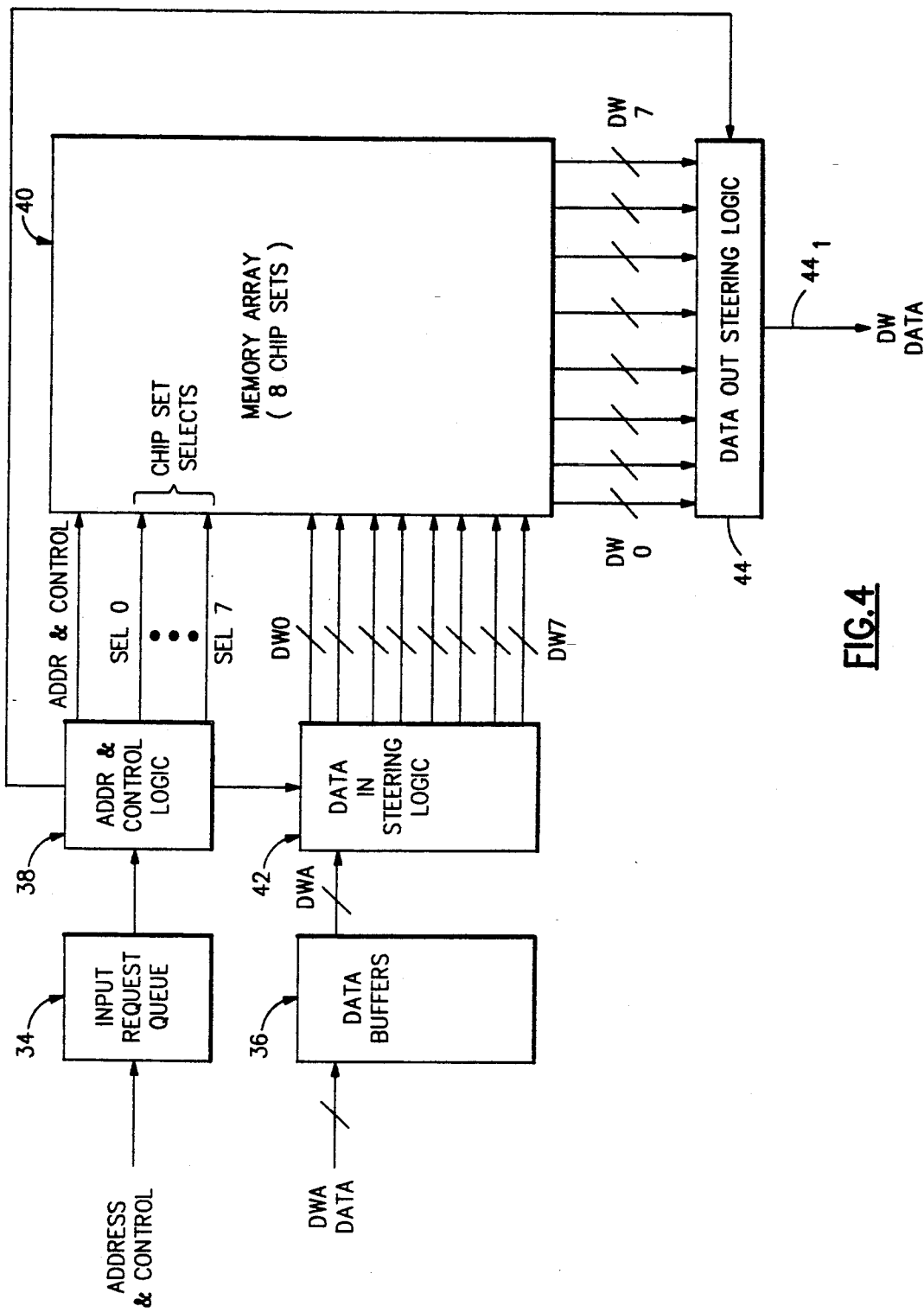
FIG. 4 is a block diagram of a BSM or memory element.

FIG. 4 shows the BSM design. Address and control information (FIG. 3A) from the cross-point switch 13 (FIG. 1) are stored in the input request queue 34 while data, in one double word (DW) elements, is stored in the data buffers 36. The request queue stores multiple requests in FIFO (first-in first-out) order. The address and control information in the queue 34 is accessed by the address and control logic 38 which generates the required address and control signals and chip set select signals to the memory array 40. For the example illustrated, it is assumed that the memory array 40 is composed of eight chip sets or rows $R_0$-$R_7$. The data in buffers 36 are accessed by the steering logic 42 which inputs data to the memory array 40 under control of address and control logic 38. The address and control logic 38 also provides data out control signals to data out steering logic 44. The data out steering logic 44 includes buffers for storing data read out of the memory array 40 and outputs data on DW bus 44$_1$.

Figure 5:
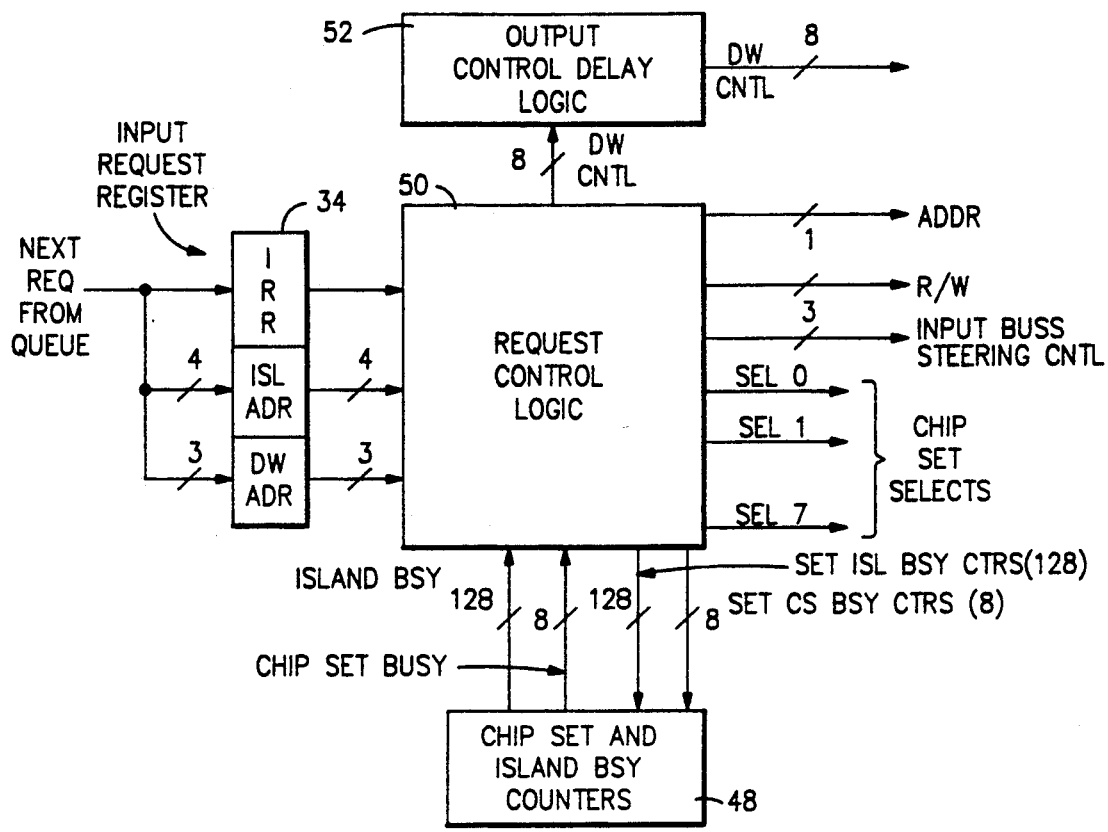
FIG. 5 is a block diagram of the BSM address and control logic.
Figure 5A:
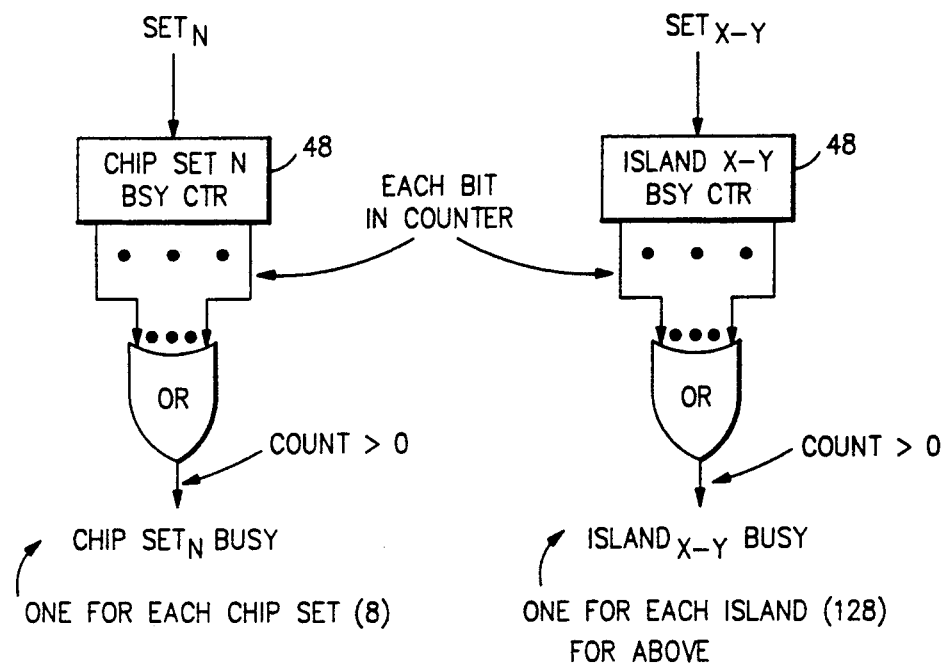
FIG. 5A illustrates chip set and island busy counters of the BSM.

The request at the top (the next out in FIFO order) of the request queue 34 at register 34A is supplied to the address and control logic 38, which is shown in more detail in FIG. 5. The address and control logic 38 includes the request control logic 50, the chip set and island busy counters 48 and the output control delay logic 52 shown in FIG. 5. The input request register (IRR) 34A holds the currently executing request with its fields. Block 48 represents a set of eight chip set busy counters 48$_0$–48$_7$ and 128 island busy counters 48$_{0\text{-}0}$ through 48$_{7\text{-}15}$. The chip set counters keep track of which of the eight chip sets are available to accept a request. FIG. 5A illustrates one each of the chip set and island busy counters. The chip set busy counters 48 are counters that count down from a preset value to zero. The preset value is the chip busy time which, in the example being described, is two machine cycles. On every cycle, all eight of the counters are decremented by one unless already at zero, in which case they remain at zero indicating not busy for the corresponding chip set. When a request is made, the corresponding chip set busy counters are set to the preset value. This occurs on the cycle that the chip set is made busy. The island busy counters are preset in the same way (16 cycles for the island busy of this embodiment).

Figure 5B:
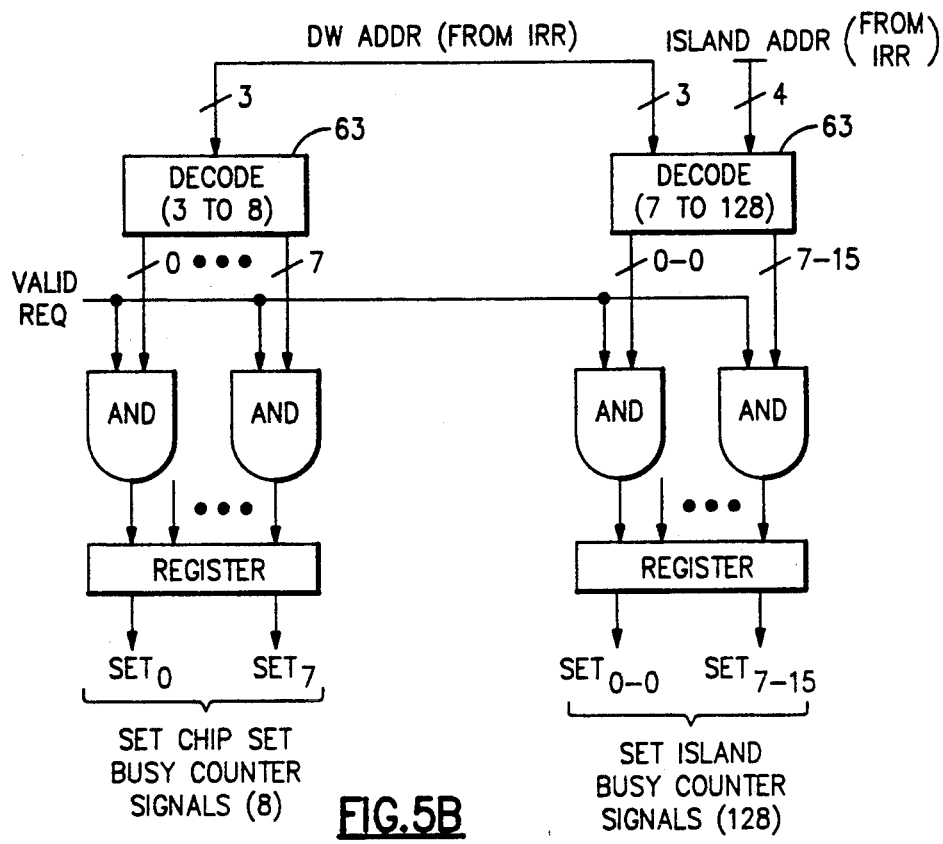
FIG. 5B illustrates the chip set and island set counter logic.

The request control logic 50 includes the chip set and island set counter logic of FIG. 5B. The DW address from IRR 34A is decoded at decoder 60 and if valid the register 61 is set to provide the set signal to the appropriate chip set counter (counter 48N in FIG. 5A) to set that counter to the preset value. Similarly, the DW address and the island address from the IRR is decoded at 63, the register 64 is set, and the appropriate island counter 48$_{x\text{-}y}$ is preset. The DW address in the control logic 50 also generates control for both the input and output data steering logic 42 and 44 shown in FIG. 4. The control of the output data is delayed by a set of shift registers 52 to account for the chip set access time. The chip set busy and island busy counters 48 and logic 50 thereby provide a means to determine if a chip set (or row or island) is busy from a previous request. The logic 50 includes either a microcode or a state machine that follows the flow diagram of FIG. 9.

Figure 6:
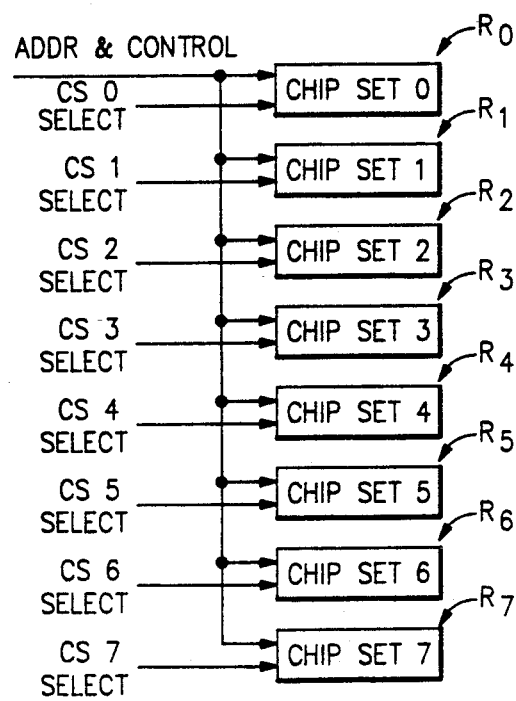
FIG. 6 illustrates memory array addressing.
Figure 7:
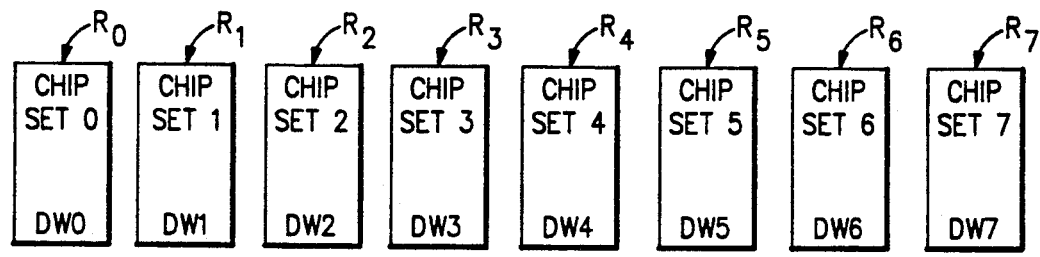
FIG. 7 illustrates the placement of data within the chip sets.
Figure 8:
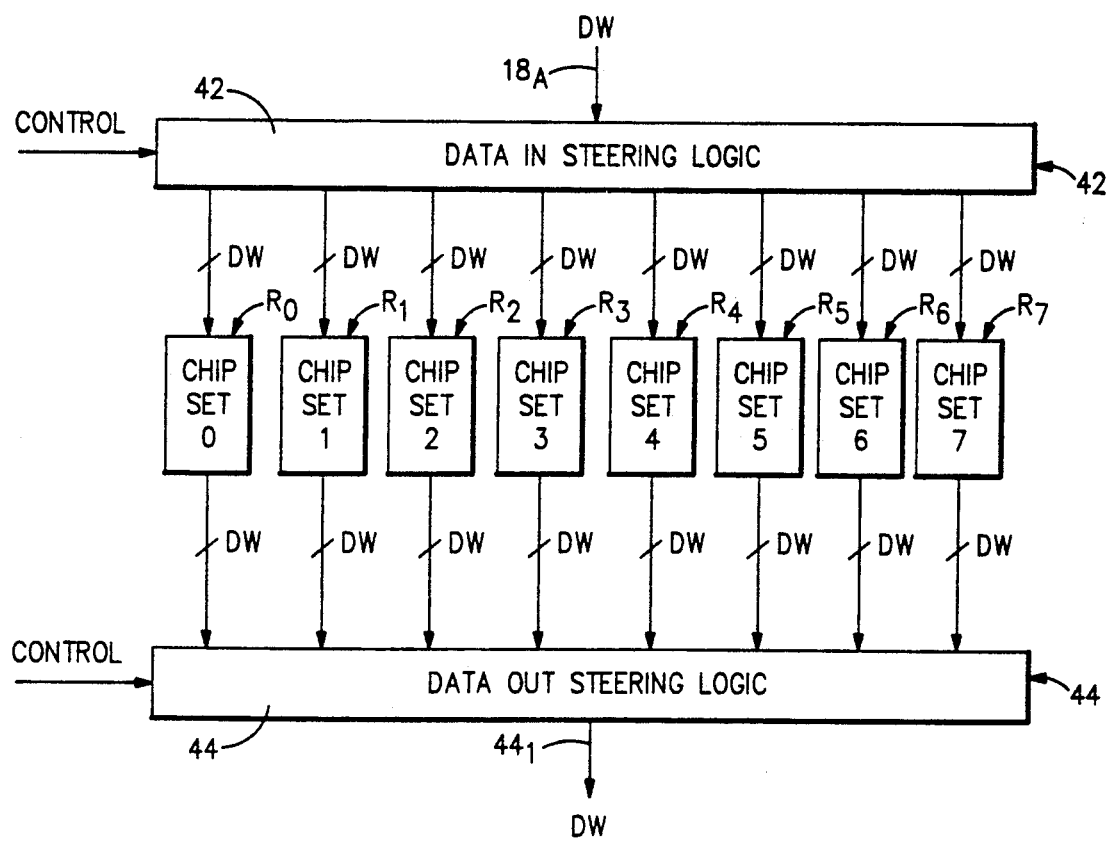
FIG. 8 illustrates the data flow for the BSM.

FIG. 6 illustrates the chip set that constitutes the memory array 40. In this example, there are eight chip sets or rows R$_0$ to R$_7$. As shown in FIG. 7, each chip set or row comprises a DW interleave, such that DW$_0$ is contained in interleave zero, DW$_1$ is contained in interleave one, and so forth. The logic on the BSM allows the DW from an interleave to be placed on the DW bus. FIG. 8 is a block diagram showing the data flow for the BSM with the eight chip sets. The data in steering logic 42 receives double words, denoted DW, at bus 18A and steers the DW to corresponding chip set (R$_0$–R$_7$) Likewise, the data-out steering logic 44 receives DWs from each of the eight chip sets, selects one of these DWs and outputs it on the DW bus 18B.

Figure 9:
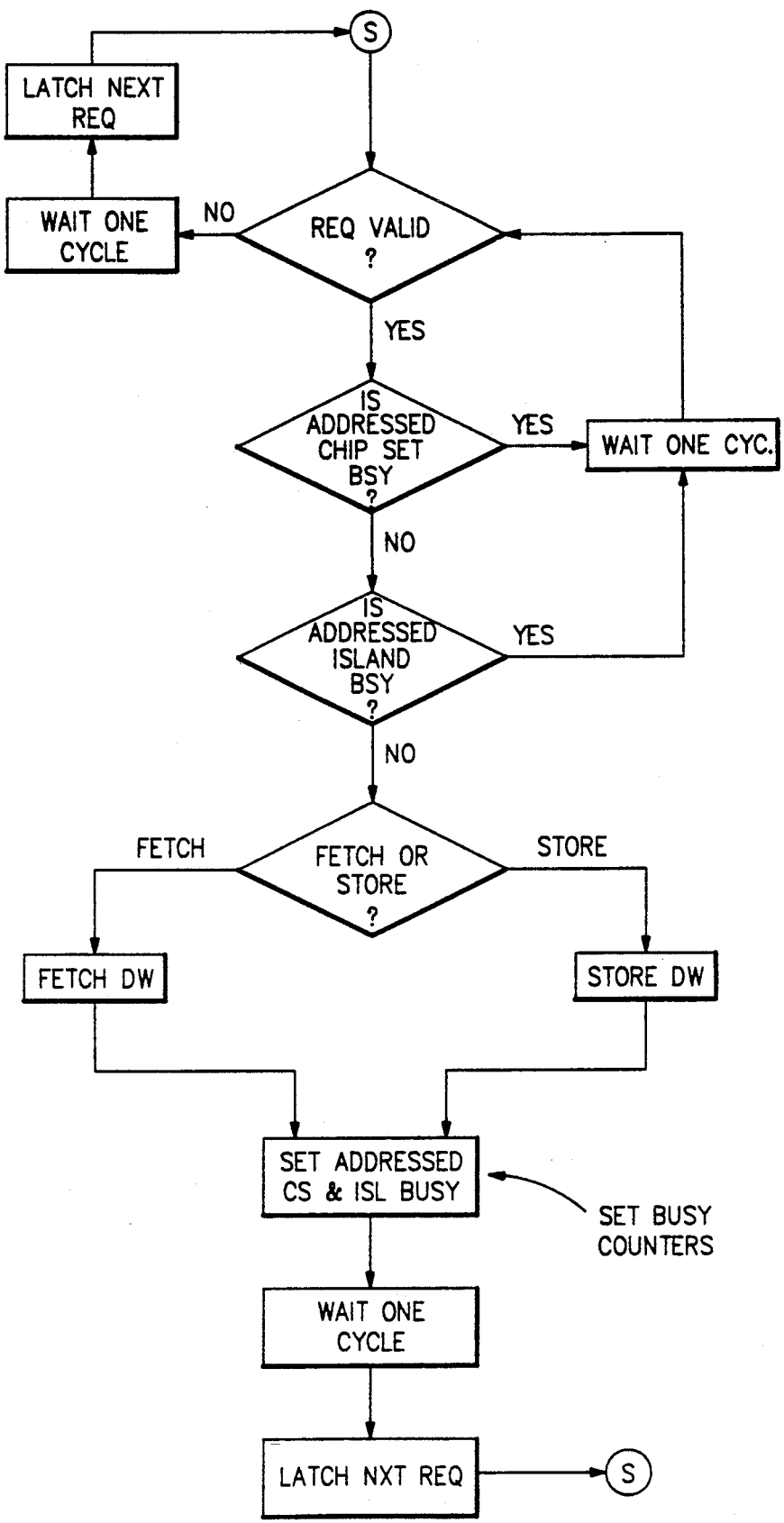
FIG. 9 is a BSM flow diagram.
Figure 10:
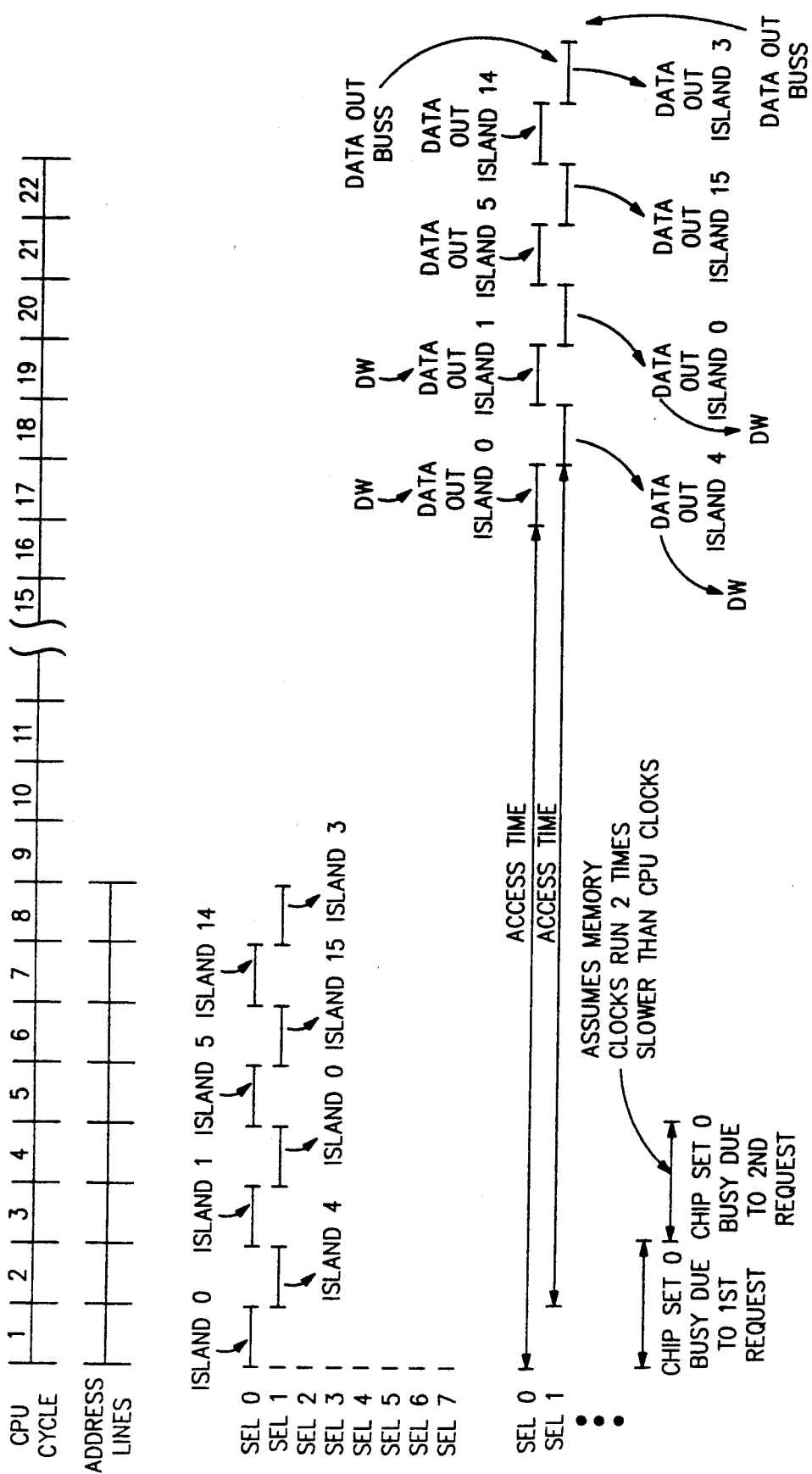
FIG. 10 is a timing diagram for the BSM.

Referring to FIG. 9, operation of the logic 50 is as follows. The control logic decodes the DW address at the decoder (decoder 60 in FIG. 5B) and if the request is not "valid" (e.g. there is no request) the system waits one machine cycle and latches the next request in the register (register 61 in FIG. 5B). If the request is "valid" the logic then looks to see if the chip set is busy. If "busy", the same chip set is looked at again after one cycle as shown in FIG. 10. If the chip set is not busy, then the decoded island address is looked at to see if it is busy. If busy, the island must wait one cycle before it can be addressed again if the chip set is not busy. If the island is not busy the fetch or store operation is performed. When fetching or storing the chip set and island busy counters are set. Each cycle a different chip set can be accessed as shown in FIG. 10. The same chip set can be accessed after two cycles to provide the access into a different island. The data access to the same island on the same chip set requires 16 cycles as preset by the counters. After the setting of the busy counters the system waits one cycle before latching the next request (at registers 61 and 64 in FIG. 5B).

Figure 11:
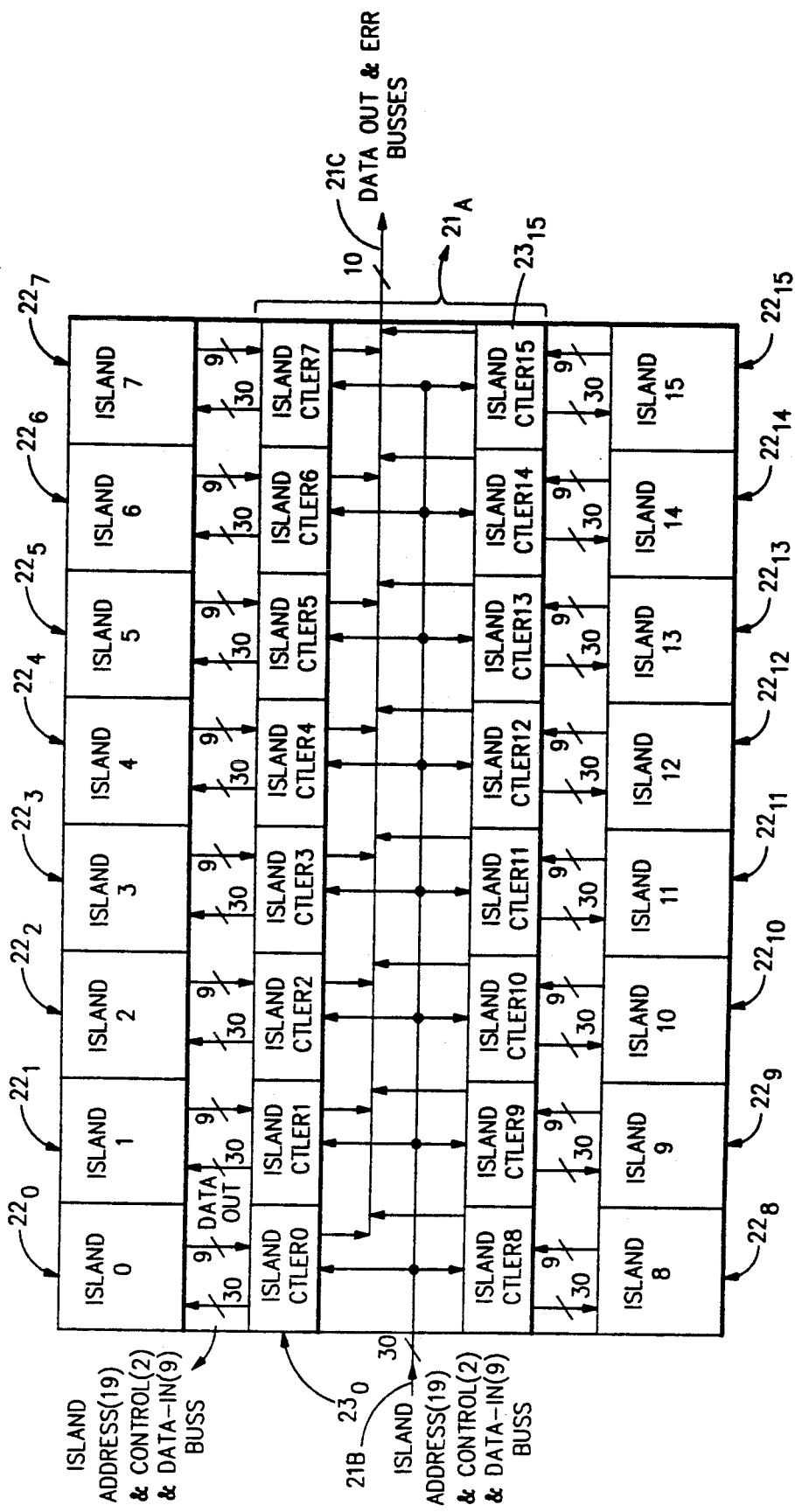
FIG. 11 is a diagram of a memory chip.

Referring to FIG. 11 there is illustrated a diagram of a memory chip. The memory chip includes 16 islands (22$_0$ to 22$_{15}$) where each island has 32K word locations that hold 9 data bits each. The 9-bit island word address is 15 bits long (bits 12 through 26). The islands are distributed as shown along opposite long edges of the chip. The control section 21A includes data and control buses and island controllers (23$_0$–23$_{15}$) with the island controller for each island located between that island and the address, data and control buses along the center of the chip. As shown in FIG. 11 the island address, data-in and control lines of the input bus 21B to the chip is applied along the center long axis of the chip and has coupled branches to the island controllers (23$_0$–23$_{15}$) for each island distributed along each side of the bus 21B. The data output (9 bits) plus error signal line is coupled along output bus 21C. The address (15 bits), data and control is passed from the controller to the island and the data from the island at the word locations is passed to the island controller.

Figure 12:
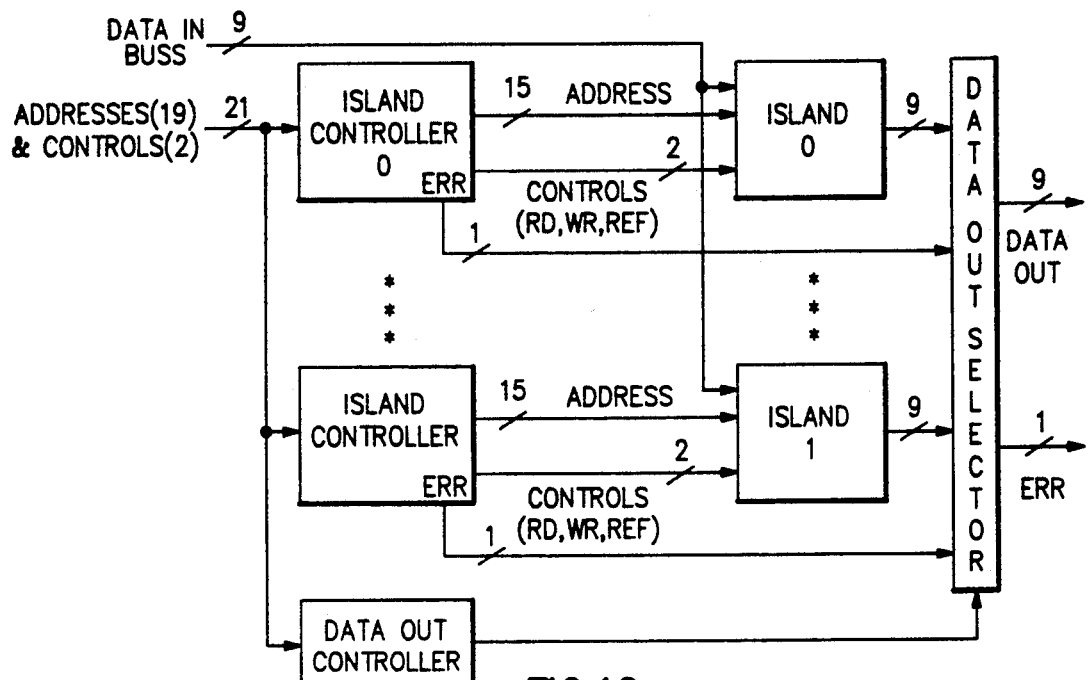
FIG. 12 is a simplified logic diagram of a memory chip.
Figure 13:
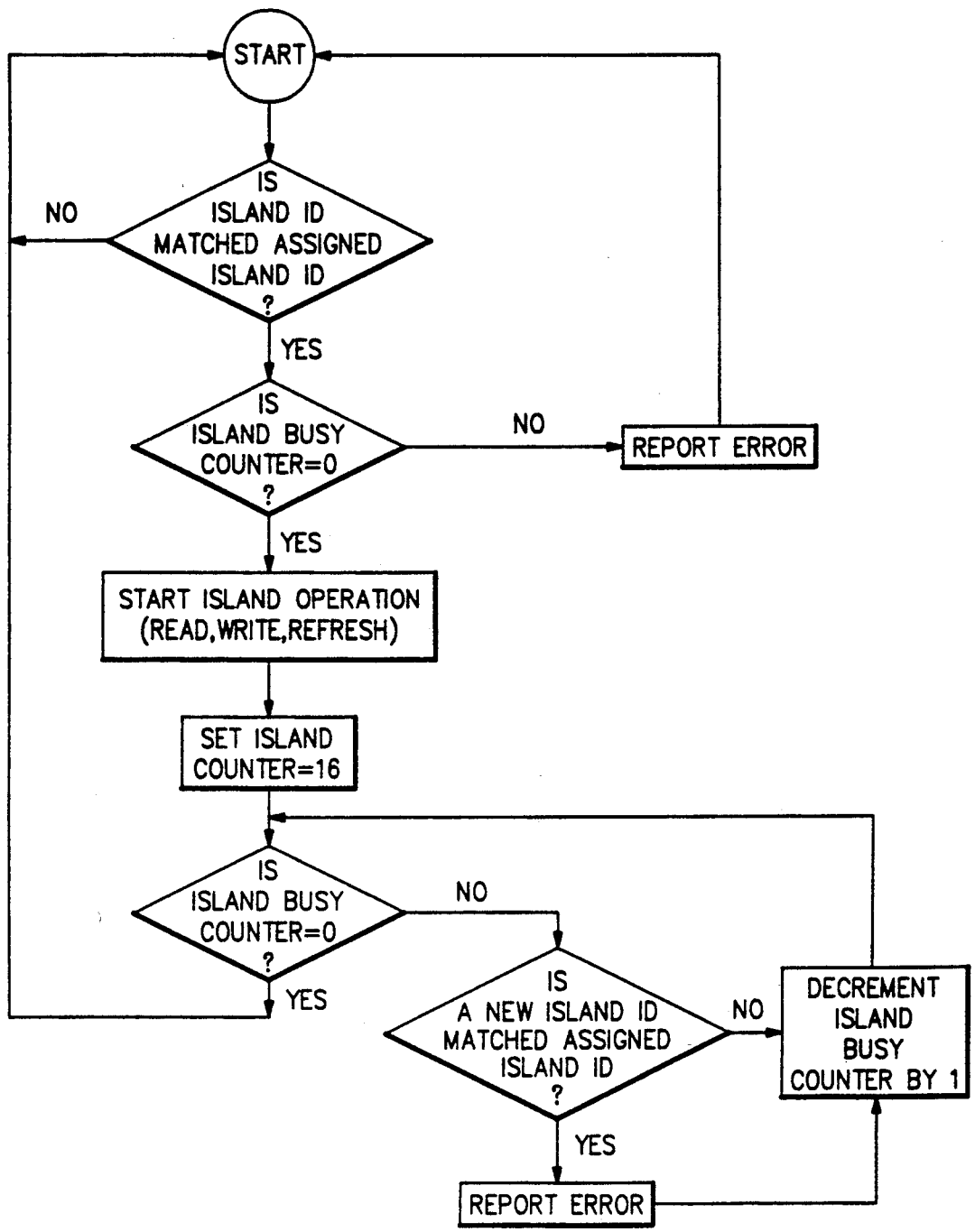
FIG. 13 is a flowchart of island controller.

Referring to FIGS. 12 and 13, there is illustrated the data flow of a memory chip as shown in FIG. 11. Each island controller receives the island addresses and the identified controller checks to see if valid and if valid checks the island ID with that of the address and if correct starts the read or write operation. A 2-bit signal from the island controller controls the read or write operation. The island controller also forwards the 15 bit address to access the 9-bit word from the 32K word array of the island. A read or write operation sets an island busy counter in the island controller which times out 16 cycles to provide an error signal if the new island ID matches that assigned and the island counter has not counted down to zero. The error signal is coupled back to the BSM.

Figure 14:
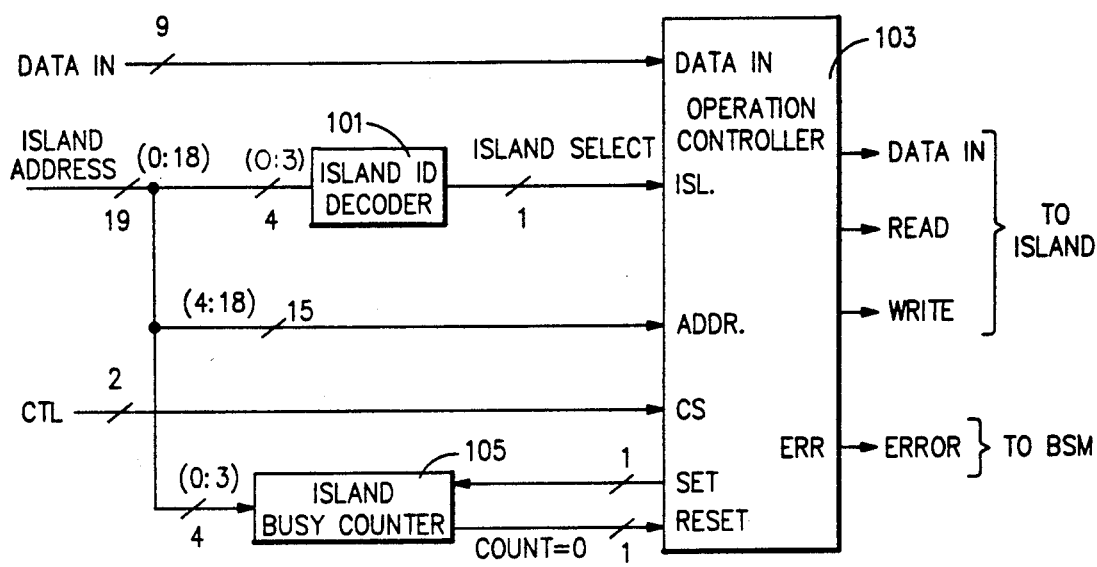
FIG. 14 is a detailed design of an island controller.

Referring to FIG. 14 there is a block diagram of an island controller. The 19-bits of the island address include 4 bits identifying the island (0–15) on the chip and the other 15 bits identifying the word locations on the island. The island ID decoder 101 provides an island select when the island's ID matches the incoming address. The operation controller 103 comprises a state machine or includes microcode performing the operation of flow chart of FIG. 13. An island busy counter 105, when it detects the matched island ID address, sets the counter. The island busy counter provides a busy signal until the island busy counter becomes zero whereupon it provides a reset. If the island is busy and the incoming address matches that of it's ID and the counter has not been reset to zero it provides an error signal to the BSM. The control signals for read and write are sent to the controller and the island busy detector.

Figure 15:
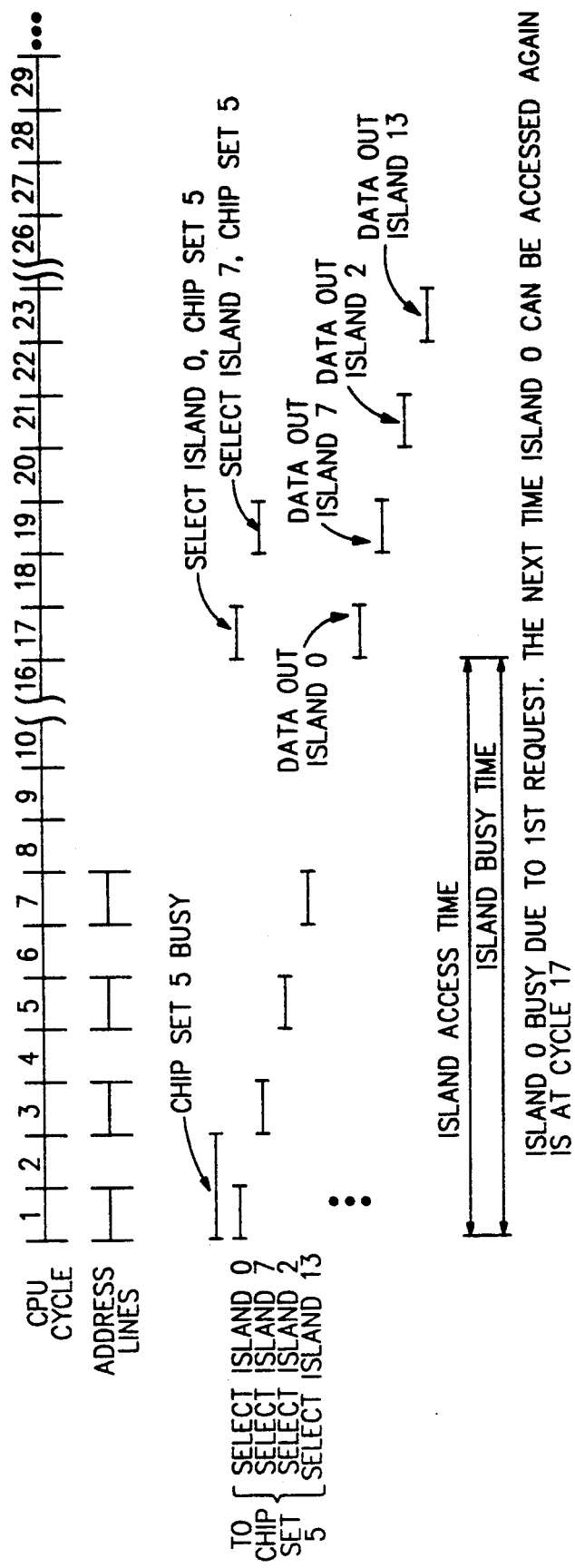
FIG. 15 is a timing diagram of island access.

Referring to FIG. 15 there is illustrated the timing on an island. The island access and busy time is 16 cycles. For example, island 0 is selected during cycle 1 and the data is provided out at cycle time 17. The island 0 can be accessed with a new request on cycle 17 or thereafter. Different islands on the same chip can be selected every other cycle.

While the invention has been particularly shown and described with reference to preferred embodiments thereof, it will be understood by those skilled in the art that various changes in form and details may be made therein without departing from the spirit and scope of the invention.

We claim:

1. A memory system comprising:
   a plurality of memory elements, each element being separately addressable, each element including memory chip groups with each group including a plurality of memory chips, each memory element capable of accepting a read or write access on every computer cycle, each memory chip group being interlaced and started at offset times, each chip within each group comprising a plurality of memory islands, each of said memory islands being separately addressable; and
   logic means within each of said memory elements to steer an address to the correct memory island on a memory chip.

2. The system of claim 1 with a queue within each memory element for storing requests for a busy island and means for restoring service as soon as the busy island becomes idle.

3. The system of claim 2 wherein said means for restoring includes chip group counters and island busy counters and means for decoding accesses to said chip groups or islands for presetting said chip group counters and island busy counters to known array busy cycles.

4. The system of claim 3 including an island controller on each of said memory chips for each island.

5. The system of claim 4 wherein said island controller includes an island decoder and an island busy counter.

* * * * *